United States Patent [19]

Rijckaert et al.

[11] Patent Number: 4,517,612
[45] Date of Patent: May 14, 1985

[54] REPRODUCING APPARATUS WITH CONTROLLED GAIN OUTPUT INDEPENDENT OF TRACKING ERRORS

[75] Inventors: Albert M. A. Rijckaert; Edmond de Niet, both of Eindhoven, Netherlands

[73] Assignee: U.S. Philips Corporation, New York, N.Y.

[21] Appl. No.: 401,042

[22] Filed: Jul. 22, 1982

[30] Foreign Application Priority Data

Aug. 17, 1981 [NL] Netherlands .................. 8103833

[51] Int. Cl.³ .............................................. G11B 5/02
[52] U.S. Cl. .......................................... 360/67; 360/47
[58] Field of Search ................ 360/47, 38.1, 27, 67, 360/77; 324/207, 208, 243; 369/48, 49, 174, 43

[56] References Cited

U.S. PATENT DOCUMENTS

| | | | |
|---|---|---|---|
| 2,977,579 | 3/1961 | Mullin | 360/77 |
| 3,246,307 | 4/1966 | Stanley | 360/77 |
| 3,501,585 | 3/1970 | De Lange | 360/67 |
| 4,055,849 | 10/1977 | Hickok | 360/77 |

FOREIGN PATENT DOCUMENTS 2022874A 12/1979 United Kingdom ................. 360/76

Primary Examiner—Bernard Konick
Assistant Examiner—Steven R. Garland
Attorney, Agent, or Firm—Robert T. Mayer; Algy Tamoshunas

[57] ABSTRACT

An apparatus for reproducing information from a track of a magnetic record carrier by means of a reproducing head divided into two reproducing portions. The apparatus comprises an amplifier circuit having a pair of input terminals, connected to the outputs of the two reproducing portions, a first signal combination unit, at least one variable gain amplifier and an output terminal. The controllable amplifier is connected between the output of the signal combination unit and the output terminal of the amplifier circuit. The gain of the amplifier is controlled in such a way that upon application of the two signals to the input terminals of the amplifier circuit, a signal is obtained on the output terminal having an amplitude u which is in a fixed ratio to the amplitude of the larger of the two signals applied to the two input terminals.

13 Claims, 3 Drawing Figures

REPRODUCING APPARATUS WITH CONTROLLED GAIN OUTPUT INDEPENDENT OF TRACKING ERRORS

The invention relates to an apparatus for reproducing information from a track of a magnetic record carrier by means of a reproducing head divided into two reproducing portions each having an output on which an information signal is available. The said outputs are connected to a first and a second input terminal of an amplifier circuit, which amplifier circuit further comprises an output terminal and a first signal combination unit, connections being arranged between the first and the second input terminal respectively and a first and second input respectively of the first signal combination unit and between an output of the first signal combination unit and the output terminal. The invention also relates to an amplifier circuit for use in an apparatus in accordance with this invention. An apparatus of the type is known from U.S. Pat. No. 4,055,849. The first signal combination unit in said apparatus functions as an adder. The patent describes an apparatus in which, depending on a control signal, the reproducing head is brought into or maintained in the correct position relative to the track, so that the value by which the information read from the record carrier is amplified remains constant. Such a dynamic tracking system is very expensive and consumes much power.

The object of the invention is to provide an apparatus which also supplies an information signal whose magnitude is substantially independent of tracking errors, but which is substantially cheaper and has a lower power dissipation than the known apparatus. To this end the apparatus in accordance with the invention is characterized in that the amplifier circuit comprises at least one controllable amplifier which is arranged in one of the connections. The controllable amplifier has a gain factor which is variable depending on a control signal. The amplifier circuit further comprises means for obtaining said control signal in response to which control is effected in such a way that upon application of two signals of at least substantially equal phase to said first and second input terminals, respectively, an output signal is obtained having an amplitude which is in a fixed ratio to the amplitude of the larger of the two signals applied to the two input terminals.

The invention is based on the insight that, when a reproducing head divided into two portions is employed, in the case of tracking errors smaller than half the width of the information track, one of the two reproducing portions still co-operates with the information track in an optimum manner and supplies a maximum information signal. It has been found that the amplitude of the information signal at the output of said reproducing portion may be employed for a gain control so as to ensure that an output signal derived from the two reproducing portions has an amplitude which is independent of any tracking errors. It is not necessary to control the position of the divided reproducing head, which results in a substantial economoy in comparison with the described prior art.

Suitably, control is effected in such a way that the output signal of the apparatus has an amplitude which substantially corresponds to the amplitude of the larger of the two information signals applied to the two input terminals. In this way the signals output terminal and on at least one of the input terminals, have substantially equal levels, so that the contribution of the apparatus to output-signal distortion is minimized.

One embodiment of the apparatus in accordance with the invention comprises a first and a second controllable amplifier respectively, arranged in the connection between the first or second input terminal respectively of the amplifier circuit and the first or second input, respectively of the first signal combination unit. The means for obtaining said control signal comprise first and second rectifier circuits and a comparator circuit. In each input of the first signal combination unit is connected to one of the two inputs of the comparator circuit via one of the rectifier circuits. Each of the two outputs of the comparator circuit is connected to a control input of the first or second controllable amplifier, respectively, for applying a first or second control signal to the first or second controllable amplifier, respectively. Control is then effected in such a way that upon application of two signals of substantially equal phase to said first or second input terminal, respectively, the controllable amplifier connected to the input terminal receiving the signal having the higher signal amplitude is set to a specific gain factor A. The other controllable amplifier is set to a gain factor which is at least substantially equal to A times the ratio of the amplitude of the larger signal to that of the smaller signal. As a result, the output signal has an amplitude equal to 2A times the amplitude of the larger of the two signals applied to the input terminals. This is the signal from the reproducing-head portion which is still completely on the track. Therefore, as long as at least one reproducing-head portion remains fully on the track, the gain will remain constant. Preferably, A has the value 0.5. The output signal then has an amplitude equal to the amplitude of the larger of the two information signals applied to the input terminals. As stated previously, this enables the distortion in this apparatus to be minimized.

An alternative embodiment of the apparatus in accordance with the invention comprises a controllable amplifier arranged in the connection between the output of the first signal combination unit and the output terminal of the amplifier circuit. The controllable amplifier has a control input for the application of a control signal to said controllable amplifier. Control is effected in such a way that upon application of two signals of at least substantially equal phase to said first or second input terminal, the controllable amplifier is set to a gain factor which is at least substantially equal to 2A times the ratio of the amplitude of the larger of the two signals applied to the first and the second input terminal, to the amplitude of the sum of the two signals. As a result the output signal again has an amplitude of 2A times the amplitude of the larger of the two signals applied to the input terminals. Consequently, the gain factor of the apparatus also remains constant as long as at least one reproducing portion of the reproducing head remains fully on the track. This alternative embodiment has the following advantages in comparison with the first-mentioned embodiment.

(a) Only one controllable amplifier is needed in comparison with two in the first-mentioned embodiment.
(b) The required amplification range of the controllable amplifier in the last-mentioned embodiment is smaller that that of the controllable amplifier in the first-mentioned embodiment. Example: for A=0.5 the gain factor ranges between 0.5 and 1 and between 0.5 and infinity, respectively.

(c) In the first-mentioned embodiment the amplification of the signals by means of the controllable amplifier (s) generally results in a larger noise component in the output signal than in the last-mentioned embodiment.

The means for obtaining said control signal in said alternative embodiment may comprise first, second and third rectifier circuits, a comparator circuit and a second signal combination unit. The comparator circuit has two inputs and one output and serves for determining which is the larger of the two signals applied to its inputs and transferring said larger signal to its output. The inputs of the first signal combination unit are each connected to an input of the comparator circuit via the first or the second rectifier circuit respectively. The output of the comparator circuit is connected to a first input of the second signal combination unit. The output terminal of the amplifier circuit is connected to a second input of the second signal combination unit via the third rectifier circuit and in that an output of the second signal combination unit is connected to the control input of the controllable amplifier. In this case use is made both of the output signals of the two reproducing-head portions and of the output signal of the amplifier circuit in order to obtain the control signal for the controllable amplifier.

A further embodiment of the apparatus in accordance with the invention comprises a controllable amplifier which is arranged in the construction between the output of the first signal combination unit and the output terminal of the amplifer circuit. The means for obtaining said control signal comprise first, second and third rectifier circuits, a comparator circuit, a second and a third signal combination unit and a further controllable amplifier. The comparator circuit two inputs and one output and serves for determining which is the larger of two signals applied to its inputs and transferring said larger signal to its output. A third input terminal of the amplifier circuit is connected to a first input of the third signal combination unit and, via the first rectifier circuit, to one input of the comparator circuit. A fourth input terminal of the amplifier circuit is connected to a second input of the third signal combination unit and, via the second rectifier circuit, to the other input of the comparator circuit. The output of the comparator circuit is connected to a first input of the second signal combination unit. An output of the third signal combination unit is connected to an input of the further controllable amplifier, whose output is connected to a second input of the second signal combination unit via the third rectifier circuit. An output of the second signal combination unit is connected to the control inputs of the two controllable amplifiers which, have the same gain characteristics as a function of the control signal. The third and the fourth input terminal respectively receive signals which are in a specific relationship to the signals applied to the first and the second input terminal respectively. Control is effected in such a way that upon application of two signals of at least substantially equal phase to said third and fourth input terminal, respectively, the controllable amplifiers are set to a gain factor which is at least substantially equal to 2A times the ratio of the amplitude of the larger of the two signals applied to the third and the fourth input terminal, to the amplitude of the sum of the two signals.

In this case only two signals are required in order to obtain a control signal. These two signals should then be applied to the third and the fourth input terminal of the amplifier circuit. As stated in the foregoing, these signals should be in a specific relationship to the signal applied to the first and the second input terminal respectively. For example, the signals applied to the first and the second input terminal respectively, that is the output signals of the two reproducing portions may alternatively be applied to the third and the fourth input terminal respectively. However, the input signal for the third and the fourth input terminal may alternatively be other signals. If the apparatus in accordance with the invention is, for example, provided with a device for maintaining or setting the reproducing head in the correct angular position (for example, the automatic azimuth control as described in the Applicant's British Patent Application No. 79 18 351 and published as specification 2,022,874 A, which corresponds to U.S. Pat. No. 4,472,752), the signals required for said azimuth control may also be applied as input signals to the third and the fourth input terminal.

Yet another embodiment of the apparatus in accordance with the invention is characterized in that the apparatur comprises a controllable amplifier which is arranged in the connection between the output of the first signal combination unit and the output terminal of the amplifier circuit. The means for obtaining said control signal comprise first and second rectifier circuits, a comparator circuit, a second and a third signal combination unit, and a further controllable amplifier. The comparator circuit has two inputs and one output and serves for determining which is the larger of two signals applied to its inputs and transferring said larger signal to its output. A third input terminal of the amplifier circuit is connected to one input of both the comparator circuit and the third signal combination unit via the first. A fourth input terminal of the amplifier circuit is connected via the second rectifier circuit to the other inputs of both the third signal combination unit and the comparator circuit. The output of the comparator circuit is connected to a first input of the second signal combination unit. An output of the third signal combination unit is connected to an input of the further controllable amplifier, whose output is connected to a second input of the second signal combination unit. An output of the second signal combination unit is connected to the control inputs of both controllable amplifiers which have the same gain characteristics as a function of the control signal. The third and the fourth input terminal respectively receive signals which are in a specific relationship to the signals applied to the first and the second input terminal respectively, and in that control is effected in such a way that upon application of two signals of substantially equal phase to said third and fourth input terminal respectively the controllable amplifiers are set to a gain factor which is at least substantially equal to 2A times the ratio of the amplitude of the larger of the two signals applied to the third and the fourth input terminal, to the sum of the amplitudes of the two signals. This embodiment differs only slightly from the embodiment described in the foregoing, because the first or the second input respectively of the third signal combination unit is not connected to the input but to the output of the first or the second rectifier circuit respectively. Thus, the third rectifier circuit of the afore-mentioned embodiment may be dispensed with. The advantage of this apparatus over the afore-mentioned embodiment is that control is more insensitive to phase differences between the signals applied to the third and the fourth input terminal. The phase differences in said signals, which signals are, as already stated, in a specific relationship to the signals applied to the first and the second input terminal respectively-which are the output signals of the two reproducing-head portions-arise for example in that the reproducing head is in an incorrect angular position relative to the track.

It is to be noted that in the last-mentioned embodiment the further controllable amplifier differs from the first controllable amplifier in that the first-mentioned amplifier serves to amplify d.c. signals and the last-mentioned amplifier serves to amplify a.c. signals. However, these two amplifiers should be correctly in track with each other, that is, their gain characteristics as a function of the control signal should be identical.

In all embodiments, the constant A suitably has the value 0.5. The contribution to distortion by the apparatus can thus be minimized, as stated in the foregoing.

The rectifiers in the various embodiments may be half-wave or full-wave rectifiers. Full-wave rectifiers are preferred, because they reduce the influence on the control of an incorrect angular position of the reproducing head relative to the track, which gives rise to phase differences between the signals applied to the first and the second or the third and the fourth input terminal.

If in said second signal combination unit, which multiplies a signal applied to its second input by a factor $\alpha$ and subtracts it from a signal applied to its first input, and multiplied by a factor $\beta$, the resulting difference signal being transferred to its output, the factors $\alpha$ and $\beta$ are both taken to be unity, an apparatus is obtained which can supply an output signal having an amplitude equal to one time the amplitude of the larger of the two signals applied to the input terminals.

Some embodiments of the invention will now be described in more detail, by way of example, with reference to the drawing. In the drawing.

Figure 1:
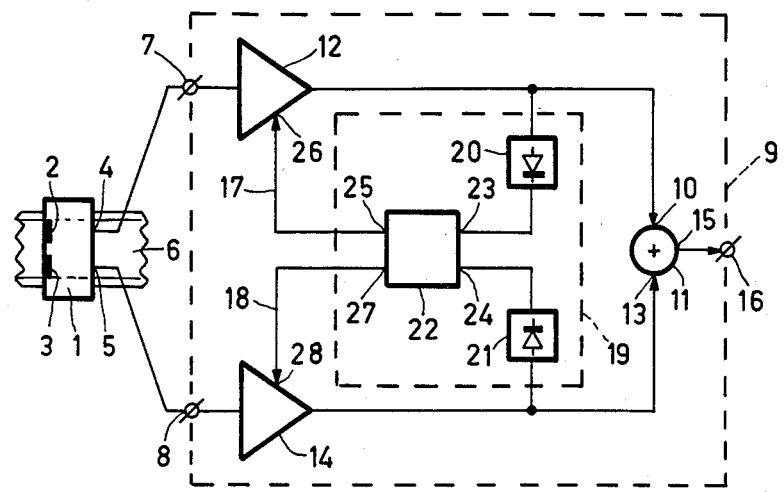
FIG. 1 shows an embodiment of the apparatus in accordance with the invention.

FIG. 1 shows an embodiment of the apparatus in accordance with the invention. The reproducing head 1, for scanning the track 6, is divided into two reproducing portions 2 and 3 each with an output 4 and 5, respectively. The outputs 4 and 5 are respectively connected to a first and a second input terminal 7 and 8 respectively of an amplifier circuit 9. A first controllable amplifier 12 is arranged in the connection between the first input terminal 7 and the first input 10 of a first signal combination unit 11. A second controllable amplifier 14 is arranged in the connection between the second input terminal 8 and the second input 13 of the first signal combination unit. In addition, the output 15 of the first signal combination unit 11 and the output terminal 16 of the amplifier circuit are connected to each other.

In the case of a correct angular position of the reproducing head relative to the track 6, the two reproducing portions 2 and 3 will supply signals of substantially equal phase, or signals with a phase difference of approximately 180°, to the input terminals 7 and 8. The first signal combination unit 11 serves to combine the signals applied to its two inputs 10 and 13 in such a way that said signals are added in phase. This means that if the two signals are substantially in phase the first signal combination unit 11 will function as an adder. If the signals applied to the inputs 10 and 13 are in phase opposition, for example because the output signals of the reproducing sections are in phase opposition or because signal inversion occurs somewhere in one of the paths from the outputs of the reproducing portions to the two inputs of the first signal combination unit 11, the first signal combination unit 11 will function as a subtractor.

The first controllable amplifier 12 and the second controllable amplifier 14 respectively have a gain factor which is variable depending on a first control signal 17 and a second control signal 18 respectively. The means for obtaining said control signals, represented by the section 19, surrounded by the broken lines, comprise first and second rectifier circuits 20 and 21 and a comparator circuit 22. The first input 10 of the first signal combination unit 11, and thus the output of the controllable amplifier 12, is connected to the first input 23 of the comparator circuit via the first rectifier circuit 20. The second input 13 of the first signal combination unit 11, and consequently the output of the controllable amplifier 14, is connected to the second input 24 of the comparator circuit 22 via the second rectifier circuit 21. The first output 25 of the comparator circuit 22 is connected to the control input 26 of the controllable amplifier 12 and supplies the first control signal 17 to the first controllable amplifier 12. The second output 27 of the comparator circuit 22 is connected to the control input 28 of the controllable amplifier 14 and supplies the second control signal 18 to the second controllable amplifier 14. Control is now effected in such a way that upon application of two signals of substantially equal phase to the input terminals 7 and 8 the controllable amplifier connected to the input terminal receiving the signal with greater amplitude is set to a gain factor equal to A, while the other controllable amplifier is set to a gain factor equal to A times the ratio of the amplitude of the larger signal to that of the smaller signal. Example: assume that signals having amplitudes $X_1$ and $X_2$ respectively are applied to the input terminals 7 and 8. When it is also assumed that $X_1$ is greater than $X_2$, the gain factor of the controllable amplifier 12 will be equal to A and a signal having an amplitude $AX_1$ will be available on its output. The gain factor of the controllable amplifier 14 is now equal to $A \cdot (X_1/X_2)$ so that on its output a signal having an amplitude $A \cdot (X_1/X_2) \cdot X_2$, which is also equal to $AX_1$, appears. This means that this control system ensures that for signals with different amplitudes, the signal with the smaller amplitude is amplified to such an extent that signals of equal amplitudes are obtained on the outputs of the controllable amplifiers 12 and 14. On the output terminal 16 this results in an output signal having an amplitude u equal to 2A times the amplitude of the larger of the two signals applied to the two inputs 7 and 8. Consequently, the present example: $u = 2AX_1$. If $X_2$ would have been greater than $X_1$, a similar calculation would have demonstrated that u is equal to $2AX_2$.

If the apparatus exhibits no tracking errors, that is if the reproducing head 1 is positioned exactly on the track 6, the amplitudes of the output signals of the two reproducing portions 2 and 3, that is $X_1$ and $X_2$ in the present example, are equal to each other, that is $X_1 = X_2$. The gain factors of the two amplifiers 12 and 14 are equal, namely A. It follows that the amplitude u of the output signal on output terminal 16 is equal to $2AX_1 (= 2AX_2)$.

If the apparatus does exhibit tracking errors, for example if the reproducing portion 3 is partly off the track 6, the output signal of reproducing portion 2 still has the same amplitude $X_1$ as in the case where the reproducing head 1 is positioned exactly on the track 6, because the reproducing portion 2 is still fully situated on the track. The amplitude $X_2$ of the output signal of the reproducing section 3 is now smaller than $X_1$. Now the same situation is obtained as in the example described in the foregoing, which showed that the amplitude u of the output signal was also equal to $2AX_1$. This means that regardless of any tracking errors the apparatus maintains the output signal u on output terminal 16 constant in the case of a constant amplitude of the information recorded in the track 6. It is obvious that this method functions correctly as long as at least one reproducing portion is entirely positioned on the track. An arbitrary value may be selected for the constant A. Suitably, the value 0.5 is selected for A. On its output terminal and at least one of its input terminals, the apparatus then carries signals of equal signal levels, so that the contribution of the apparatus to distortion of the output signal can be minimized.

Since, in principle, the amplitude of the smaller of the two signals applied on the input terminals 7 and 8 may vary between the value zero and a value corresponding to the amplitude of the larger signal, the two controllable amplifiers 12 and 14 in the embodiment of FIG. 1 should have a gain ranging from 0.5 to infinity (when A=0.5). In the connection between the output 15 of the first signal combination unit 11 and the output terminal 16, a further amplifier having a fixed gain factor may be arranged.

The rectifier circuits 20 and 21 may be half-wave rectifiers or full-wave rectifiers. Suitably, full-wave rectification is applied, after which the signals are preferably also smoothed. This has the advantage that the apparatus becomes less susceptible to phase differences in the signals applied to the two terminals 7 and 8. Said phase differences arise, for example, when the reproducing head 1 has an incorrect angular position relative to the track 6 or when the reproducing portions 2 and 3 supply signals of opposite phase. Moreover, in the case of full-wave rectification the means for obtaining the control signal 19 need not allow for possible inversions of the signals, which may occur as a result of an inverting action of elements preceding the rectifiers in the apparatus, which thereby introduce phase shifts of 180°.

A 180° phase shift caused by an inverting element in one of the connections from the reproducing portions 2 and 3 to the respective inputs 10 and 13 of the signal combination unit 11 results in said signal combination 11 performing a subtraction instead of an addition or vice versa, as already stated in the foregoing. Phase inversions resulting from an incorrect angular position of the reproducing head, which are consequently frequency-dependent, cannot be compensated for by the signal combination unit 11 and consequently appear on the output terminal 16 via said signal combination unit.

Figure 2:
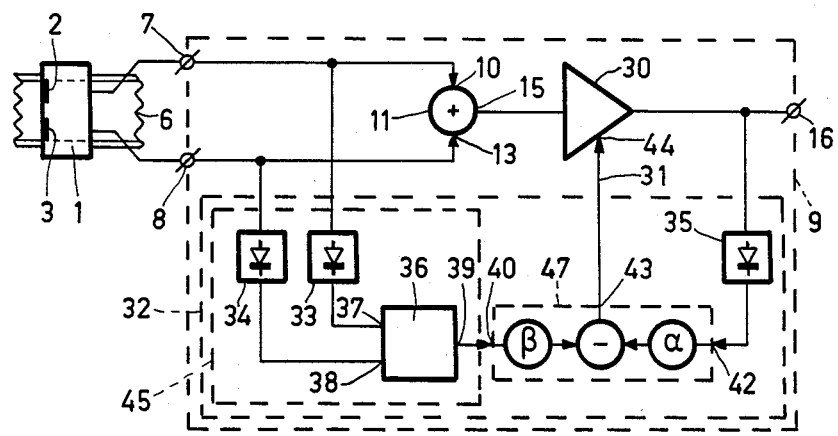
FIG. 2 shows a further embodiment.

FIG. 2 shows an alternative embodiment. Parts in FIGS. 1 and 2 having the same reference numerals are identical. In the present embodiment a controllable amplifier 30 is arranged in the connection between the output 15 of the first signal combination unit 11 and the output terminal 16 of the amplifier circuit 9. The controllable amplifier 30 has a gain factor which is variable depending on a control signal 31. The means for obtaining said control signal, represented by the section 32 surrounded by broken lines, comprise first, second and third rectifier circuits 33, 34 and 35, a comparator circuit 36 and a second signal combination unit, represented by the section 47 surrounded by broken lines. The comparator circuit 36 serves for determining which is the larger of the two signals applied to its inputs 37 and 38 and transferring said larger signal ot its output 39. The input 10 of the first signal combination unit 11, and consequently the input terminal 7, is connected to input 37 of the comparator circuit 36 via the first rectifier circuit 33. The input 13 of the first signal combination unit 11, and hence the input terminal 8, is connected to the input 38 of the comparator circuit 36 via the second rectifier circuit 34. Its output 39 is connected to a first input 40 of the second signal combination unit 47. The output terminal 16, and consequently the output of the controllable amplifier 30, is connected to the second input 42 of the second signal combination unit 47 via the third rectifier circuit 35. The output 43 of the second signal combination unit 47 is now connected to the central input 44 of the controllable amplifier 30 and supplies the control signal 31 for said amplifier. The control signal 31 is obtained by subtracting the signals applied to inputs 40 and 42 from each other in the second signal combination unit 47, which signals have been multiplied by factor $\beta$ and $\alpha$ respectively prior to subtraction.

The connection from output 43 of the second signal combination unit 47 to the control input 44 of the controllable amplifier 30 includes a correction amplifier (not shown), for example an integrator, which ensures a stable servo-control.

Control is now effected in such a way that upon application of two signals of at least substantially equal phase to the input terminals 7 and 8, the controllable amplifier 30 is set to a gain factor which is at least substantially equal to 2A times the ratio of the amplitude of the larger signal to the amplitude of the sum of the two signals.

Another example: assume that signals having amplitudes $X_1$ and $X_2$ are applied to input terminals 7 and 8 respectively. A signal having the amplitude $X_1+X_2$ now appears on the input of the controllable amplifier. If it is again assumed that $X_1$ is greater than $X_2$, that is that the apparatus exhibits tracking errors and that the reproducing portion 3 is partly off the track 6, the gain factor of the amplifier 30 will be equal to $2A \cdot X_1/(X_1+X_2)$, so that on output terminal 16, an output signal u having an amplitude $2AX_1$ is available. If $X_2$ were greater than $X_1$, a similar calculation will demonstrate that u is equal to $2AX_2$. If the apparatus exhibits no tracking errors, that is if the reproducing head 1 is positioned exactly on the track 6, the output signals of the two reproducing portions 2 and 3, that is $X_1$ and $X_2$, will be equal to each other, that is $X_2=X_1$. The gain factor of amplifier 30 is now equal to A, so that on the output terminal 16 a signal having an amplitude $2AX_1$ (= $2AX_2$) is available. Again it appears that the apparatus, regardless of possible tracking errors, maintains the output signal u on the output terminal 16 constant at a constant amplitude of the information recorded in the track 6. It is evident that the apparatus again performs correctly if at least one of the reproducing portions is still completely on the track. Again an arbitrary value may be selected for A. Suitably, the value 0.5 will be taken for A. As the gain factor of the controllable amplifier 30 is equal to $X_1/(X_1+X_2)$ (assuming that A is 0.5 and $X_1$ is greater than $X_2$) and the amplitude variations of $X_2$ may in principle vary between the value zero and the value $X_1$, it is found that the controllable amplifier 30 in the embodiment of FIG. 2 should have a gain which ranges from 0.5 to unity. Further fixed-gain amplifiers may be arranged in the connections between the input terminals 7 and 8 respectively and the taps to the rectifier circuits 33 and 34 or between said taps and the inputs 10 and 13 respectively of the first signal combination unit 11. If the gain factors of said amplifiers should not be equal, the control system for the controllable amplifier 30 must be adapted accordingly. The rectifier circuits 33, 34 and 35 may be half-wave rectifiers. However, suitably full-wave rectifiers are used followed by a device for smoothing the output signals of the rectifier circuits, because in that case the control system becomes less susceptible to possible phase differences in the two signals applied to the connection terminals 7 and 8. Said phase differences arise, for example, when the reproducing head 1 has an incorrect angular position relative to the track 6. Moreover, if full-wave rectifiers are used in order to obtain the control signal, it is not necessary to allow for possible inversions of the signals as a result of an inverting action of circuit elements which introduce 180° phase differences.

In order to obtain an apparatus whose gain factor, which is defined as the ratio of the amplitude u of the output signal on terminal 16 to that of the larger of the two input signals multiplied by two, is equal to A, $\alpha$ and $\beta$ of the second signal combination unit 47 should comply with the following relationship: $\alpha = \beta/2A$, that is: for A=0.5 $\alpha$ and $\beta$ are for example both 1. The second signal combination unit 47 then functions as a subtractor.

Figure 3:
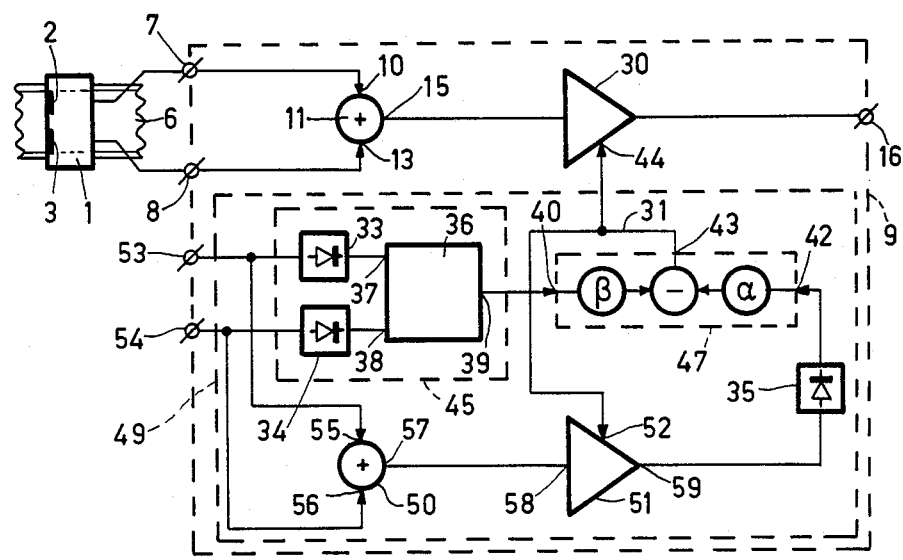
FIG. 3 shows yet another embodiment which bears great resemblance to that of FIG. 2, but which employs different means for obtaining said control signal.

FIG. 3 shows an embodiment which greatly resembles the embodiment of FIG. 2, but in which the means for obtaining said control signal are different. Parts of FIGS. 2 and 3 bearing the same reference numerals are identical. The means 49 for obtaining the control signal 31 again comprise the three rectifier circuits 33, 34 and 35, the comparator circuit 36 and the second signal combination unit 47. Furthermore, it comprises a third signal combination unit 50 and a further controllable amplifier 51 having a control input 52. A third input terminal 53 of the amplifier circuit 9 is connected to the input of the rectifier circuit 33 and to a first input 55 of the third signal combination unit 50. A fourth input terminal 54 is connected to the input of the rectifier circuit 34 and to a second input 56 of the third signal combination unit 50.

The third signal combination unit 50 will function as an adder upon application of the desired input signal—see hereinafter—to the input terminals 53 and 54. If signal inversion occurs in one of the connections before the third signal combination unit 50 the signals applied to the input terminals 55 and 56 should be subtracted from each other in the third signal combination unit.

The output 57 of the third signal combination unit 50 is connected to the input 58 of the further controllable amplifier 51. The output 59 of the controllable amplifier is now connected to the second input 42 of the second signal combination unit 47 via the third rectifier circuit 35. The output 43 of the second signal combination unit 47 is now connected to the control inputs 44 and 52 for applying the control signal 32 to the two controllable amplifiers 30 and 51. The two controllable amplifiers 30 and 51 are similar amplifiers, because they both amplify a.c. signals. Again the connections from the output 43 of the second signal combination unit 47 to the control inputs 44 and 52 respectively of the two controllable amplifiers 30 and 51 respectively include a correction amplifier (not shown), for example an integrator, which again ensures a stable servo-control.

It is to be noted that the circuit represented by the block 49 in FIG. 3 entirely corresponds to the circuit represented by the block 9 in FIG. 2. The operation of, and the control system used in, these circuits are therefore identical. This means that the control system in the apparatus of FIG. 3 is such that upon application of two signals of substantially equal phase to the third and fourth input terminals 53 and 54 a signal is obtained on the output of the further controllable amplifier 51, which signal has an amplitude which is in a fixed ratio to the amplitude of the larger of the two signals applied to the two input terminals 53 and 54. For this purpose the controllable amplifier 51 is set to a gain factor which is substantially equal to 2A times the ratio of the amplitude of the larger of the two signals applied to the input terminals 53 and 54 to the amplitude of the sum of the two signals. However, as it is not necessary to obtain a specific output signal on the output 59 of the controllable amplifier 51, but to obtain a specific output signal on the output terminal 16, the input signals on the input terminals 53 and 54 and the gain characteristics of the two controllable amplifiers 30 and 51 should comply with specific requirements. The input signals on the input terminals 53 and 54 should bear a certain resemblance to the signals applied to input terminals 7 and 8. For example, the output signals of the reproducing portions 2 and 3 may also be applied to the input terminals 53 and 54. In fact the control system is then identical to that of the apparatus of FIG. 2. However, the apparatus of FIG. 2 is preferred because it is simpler than that of FIG. 3.

However, it is alternatively possible to apply other signals to the input terminals 53 and 54. Example: if the apparatus further comprises a device for setting or maintaining a reproducing head 1 in the correct angular position relative to the track 6 (so-called automatic azimuth control as described in the Applicant's British Patent Application No. 79 18 351 and published as specification 2,022,874A, which corresponds to U.S. Pat. No. 4,472,752), the control signals used for azimuth control may be employed as input signals to the terminals 53 and 54. The two controllable amplifiers 30 and 51 should then be correctly in track with each other, that is their gain characteristics as a function of the control signals 31 should be in conformity with each other. Since they both receive the same control signal the controllable amplifier 30 will be set to the same gain factor as the controllable amplifier 51. Assuming that the signals are applied to the input terminals 7, 53 and 8, 54 respectively it will be obvious that control by means of the circuit 49 also ensures that on output terminal 16 a signal is obtained having an amplitude which is in a fixed ratio to the larger of the two signals applied to the two input terminals 7 and 8.

The rectifier circuits 33, 34 and 35 may again be half-wave rectifiers, but are suitably full-wave rectifiers followed by a smoothing circuit.

In order to obtain an apparatus whose gain factor, defined as the ratio of the amplitude u of the output signal on terminal 16 to the larger of the two input signals multiplied by two, is equal to A, the following relationship should be valid for $\alpha$ and $\beta$ of the second signal combination unit 47: $\alpha = \beta/2A$, that is: for A=0.5 $\alpha$ and $\beta$ should both be 1, for example. The second signal combination unit 47 then functions as a subtractor.

The apparatus of FIG. 3 may be simplified by connecting the first or the second input 55 and 56 respectively of the third signal combination unit 50 not to the inputs but to the outputs of the rectifier circuits 33 and 34 respectively. The rectifier circuit 35 may then be dispensed with. As a result of this the other controllable amplifier 51 is no longer identical to the controllable amplifier 30, because the first-mentioned amplifier should now amplify direct voltages. However, the amplifiers should still be correctly in track with each other, that is have the same gain characteristics as a function of the control signal 31. Controlling is now effected substantially in the same way as described with reference to FIG. 3. The only difference is now that because the inputs 55 and 56 of the third combination unit are connected to the outputs of the rectifier circuits 33 and 34, control is now effected so that the controllable amplifiers 30 and 51 are set to a gain factor which is at least substantially equal to the ratio of the amplitude of the larger of the two signals applied to the two input terminals 53 and 54 to the sum of the amplitudes of the two signals (and not to the amplitude of the sum—as in the foregoing).

The advantage of such a control system in comparison with the control systems of the embodiments of FIGS. 2 and 3 is that phase difference between the two signals applied to the inputs 53 and 54 are less problematic, which phase differences, as stated in the foregoing, may for example be caused by an incorrect angular position of the reproducing head relative to the track.

If the two signals are to be scanned from a stereo track, the two reproducing heads, one for each track, should be divided and each reproducing head should be provided with an apparatus in accordance with the invention.

If the distance between the two reproducing heads is exactly equal to the distance between the tracks, it would in principle suffice to provide the means for obtaining the control signal only once, to derive the input signals for said means from the one or the other reproducing head, and to apply the resulting control signal to the controllable amplifiers associated with the two tracks.

It will be appreciated that the invention is not limited to the embodiments shown here, but that the invention may also be applied to those embodiments which differ from the embodiments described in respect of points which are irrelevant to the invention.

What is claimed is:

1. An apparatus for reproducing information from a track on a magnetic record carrier, said apparatus comprising a reproducing head divided into two reproducing portions each having an output for supplying an information signal representative of information read from said track, and an amplifier circuit having a pair of input terminals each connected to a respective one of said outputs of said reproducing portions and an output terminal for supplying an output signal representative of said information, said amplifier circuit comprising a first signal combination unit for combining said information signals, said first combination unit having a pair of inputs and an output, first means for connecting each of said input terminals to a respective one of said pair of inputs of said first combination unit and second means for connecting said output of said first combination unit to said output terminal, one of said first and second connecting means including at least one controllable amplifier having a variable gain factor, said amplifier circuit further comprising means for controlling said at least one controllable amplifier, said controlling means having a first input for receiving a first signal indicative of the amplitude of one of said information signals, a second input for receiving a second signal indicative of the amplitude of the other of said information signals, an output for supplying a control signal to said at least one controllable amplifier, and said controlling means including means for determining which of said information signals has the larger amplitude from said first and second signals, said at least one controllable amplifier being controlled by said controlling means such that said output signal supplied to said output terminal has an amplitude which is in a fixed ratio to the amplitude of the larger of the two information signals supplied by said two reproducing portions.

2. An apparatus as claimed in claim 1 wherein said reproducing portions of the head are in-line to each other and normal to the track such that said information signals supplied to said input terminals have substantially equal phase.

3. An apparatus as claimed in claims 1 or 2 wherein the gain of said at least one controllable amplifier is controlled bt said controlling means such that the amplitude of said output signal is substantially equal to the amplitude of the larger of the two information signals supplied by said reproducing portions.

4. An apparatus as claimed in claims 1 or 2 wherein said first connecting means includes a pair of controllable amplifiers, a respective one of said controllable amplifiers being connected between each of said input terminals and a respective one of said inputs of said first combination unit, and wherein said controlling means includes a pair of outputs each supplying a control signal and a pair of rectifier circuits, and said determining means comprises a comparator circuit having a pair of inputs each defining one of said first and second inputs of the controlling means and a pair of outputs each defining one of said outputs of said controlling means, each of said inputs of said comparator circuit being connected via one of said rectifier circuits to a respective one of said inputs of said first combination unit, each of said outputs of said comparator circuit being connected to a respective one of the pair of said controllable amplifiers for controlling the gain thereof in dependence on control signals supplied by said comparator circuit.

5. An apparatus as claimed in claim 4 wherein the pair of said controllable amplifiers are controlled such that the controllable amplifier connected to the input terminal receiving the information signal having the higher amplitude is set to a specific gain factor A and the other controllable amplifier is set to a gain factor which is at least substantially equal to A times the ratio of the amplitude of the larger information signal to that of the smaller information signal.

6. An apparatus as claimed in claim 5 wherein the gain factor A is equal to 0.5.

7. An apparatus as claimed in claim 4 wherein said rectifier circuits are full-wave rectifiers.

8. An apparatus as claimed in claims 1 or 2 wherein said second connecting means comprises said at least one controllable amplifier which is connected between said output of said first combination unit and said output terminal and said controlling means controls the gain of said controllable amplifier such that the gain thereof is set to a factor which is at least substantially equal to 2A times the ratio of the amplitude of the larger of the two information signals supplied by said reproducing portions to the amplitude of the sum of said two information signals.

9. An apparatus as claimed in claim 8 wherein said gain factor of said controllable amplifier is variable between 0.5 and 1.

10. An apparatus as claimed in claim 8 wherein said controlling means comprises a pair of rectifier circuits and said determining means comprises a comparator circuit having a pair of inputs each defining one of said first and second inputs to the controlling means and each being connected via one of said rectifier circuits to a respective one of said input terminals, said comparator circuit further having an output defining said output of said controlling means, said comparator circuit determining which of the two signals applied to said inputs thereof is the larger and transferring said larger signal to said output thereof, said controlling means further including a third rectifier circuit and a second combination unit having a first input connected to said output of said comparator circuit, a second input connected via said third rectifying circuit to said output terminal and an output connected to a control input of said controllable amplifier so as to control the gain thereof.

11. An apparatus as claimed in claim 10 wherein said second combination unit means subtracts signals applied to said first and second inputs thereof and supplies the resulting difference signal at said output thereof.

12. An apparatus as claimed in claim 1 or 2 wherein said second connecting means comprises said controllable amplifier which is connected between said output of said first combination unit and said output terminal, and wherein said controlling means includes means for supplying a first signal which is proportional to the amplitude of the larger of said information signals, means for supplying a second signal proportional to the sum of the amplitudes of said information signals and means for deriving from said first and second signals a control signal for controlling said controllable amplifier so that said gain thereof is set to a factor substantially equal to a constant multiplied by the ratio of said first signal to said second signal.

13. An apparatus for reproducing information from a track on a magnetic record carrier, said apparatus comprising a reproducing head having two reproducing portions each supplying an information signal representative of information read from said track, means for combining said information signals so as produce a sum signal representative of the sum of said information signals, means for determining which of said information signals is the larger signal, said determining means generating a first signal which is proportional to the amplitude of the larger of said information signals, means for generating a second signal proportional to the sum of the amplitude of said information signals, and variable gain amplifying means for amplifying said sum signal in dependence on said first and second signals by a gain factor substantially equal to a constant multiplied by the ratio of said first signal to said second signal so as to compensate for tracking errors.

* * * * *